June 1, 1971 J. R. DALE ET AL 3,581,386

METHODS OF MANUFACTURING SEMICONDUCTOR DEVICES

Filed July 3, 1968

INVENTOR.

BY JOHN R. DALE
MICHAEL J. JOSH

AGENT 3,581,386

METHODS OF MANUFACTURING SEMICONDUCTOR DEVICES

John Robert Dale, Brighton, and Michael John Josh, Reigate, England, assignors to U.S. Philips Corporation, New York, N.Y.

Filed July 3, 1968, Ser. No. 742,380
Claims priority, application Great Britain, July 7, 1967, 31,353/67
Int. Cl. B01j *17/00;* H01l *7/24*
U.S. Cl. 29—590 15 Claims

ABSTRACT OF THE DISCLOSURE

A method for providing electrically conductive connections to a semi-conductive device comprising a body semi-conductive material having an apertured insulating layer covering at least a portion of the surface of the material. A layer of malleable metal is placed over and in contact with the insulating layer and pressure welded to the insulating layer and through the aperture to the semi-conductive material by applying pressure and heat which heats the material and the metal layer to a temperature below the eutectic temperature of the semi-conductive material and the metal.

Figure 1A:
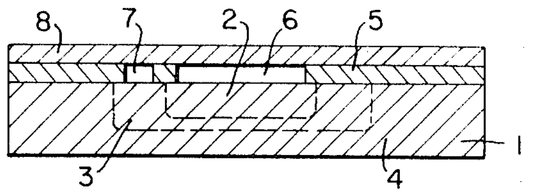

The invention relates to methods of manufacturing semiconductor devices.

One of the problems in the manufacture of semiconductor devices is that of providing connections to the different regions of the devices. This problem is of general interest and of particular importance in the manufacture of semiconductor integrated circuits where a large number of connections has to be provided.

Integrated circuits may be made from a semiconductor body on which an apertured insulating layer is provided and connection made to the regions of the semiconductor body by way of the apertures. A convenient known way of providing conductors is to deposit an electrically conductive layer over the surface of the apertured layer, for example by vacuum evaporation deposition, and to etch a desired pattern from the layer with the aid of photographic techniques and a photosensitive resist material so that a pattern of conductors is provided adhering to the insulating layer and providing electrical contact to the regions of the semiconductor body through the apertures.

When large area contacts are required to be made to semiconductor devices, for example for high-current devices, as back contacts for integrated circuits or as collector contacts for transistors, they are either provided by vacuum evaporation deposition or by alloying.

The object of the invention is to provide an alternative method of manufacturing semiconductor devices.

According to the invention, in a method of manufacturing a semiconductor device, a layer of malleable metal is provided on a substantially flat surface of a body at least part of which is of semiconductor material and the metal layer and the body are placed under pressure preferably for a period not exceeding five minutes in a press at a temperature below the eutectic temperature of the metal of the layer and the semiconductor material so that a pressure weld is effected between the body and the metal layer over an area of at least 0.25 sq. mm. and whereby electrically conductive connection is provided between the metal layer and semiconductor material. The metal layer may be in the form of a foil. The substantially flat surface may be an apertured insulating layer, in which case the metal layer is pressure welded to adhere to the insulating layer and also to provide electrically conductive connections to the semiconductor body through the apertures.

The method according to the invention provides a satisfactory solution in that if foil is used the welded foil is less brittle than the known method using an evaporated layer, can be provided more cheaply and in a much shorter time than an evaporated layer, in general provides a better adherence and electrical contact and the welded foil does not need an after-baking, annealing treatment as an evaporated layer usually does. Compared with an alloyed contact, again the time necessary is shorter and essentially no separate heating step is needed. If the metal layer is an evaporated layer, the compacted layer provided after the pressure welding provides a better contact than the untreated evaporated layer. If the pressure welding is effected at an elevated temperature, the time in the press may be reduced.

It is mentioned that connecting wires have been bonded to contact areas of semiconductor devices, including integrated circuits, by a bonding process, such as wedge bonding, which usually includes heating, but such bonds have been made over only a small surface area that is much less than 0.25 sq. mm. In local bonding a wire 17$\mu$ to 50$\mu$ in diameter may be used and bonded to the body over a small length of the wire with also a lateral spread of the wire. The area of the bond will depend on the device. With the method according to the invention, the area may readily be made greater for any particular device for example to include the provision of conductive connections and also a number of connections may be made at the same time. It is surprising that compression bonding can be carried out over a comparatively large surface area of a material substrate which consists of or comprises semiconductor material which is in general brittle.

In this connection it is mentioned that, as is typical of slices of semiconductor material, thin silicon slices need careful handling and are usually handled with tweezers in order to avoid fracture.

The metal layer may be applied in the form of a continuous foil or may alternatively be patterned so that no material or less material is required to be removed by etching at a subsequent stage in the manfacture. The metal layer may terminate within the boundary of the body or as a foil may project beyond the edge of the body to facilitate the provision of further conductive connections to the device. If the applied foil is in part patterned or if it is applied as a continuous sheet, the pressure-welded foil may subsequently be covered with an optically-sensitive layer, the optically-sensitive layer being exposed and developed to provide a desired patterned resist layer to permit unwanted areas of the metal layer which are unprotected by the resist layer to be etched away. Where a metal layer is patterned so that no material is required to be removed by etching at a subsequent stage, the pattern may be separated pieces. It will obviously not be attractive to arrange the pieces accurately and individually and this method will in general be used only if the pieces can be provided secured to an edge portion or edge portions which can be cropped after the pressure welding to separate the pieces electrically. As an alternative, the pattern may be applied directly to the body by means including an evaporation technique in which case a separate after-treatment by heating is not essential and the deposited material may be considered to be compacted to become a foil by the initial application of pressure and heat in the pressure welding process.

The pressure applied may be high, for example, at room temperature, a pressure of 20 tons/sq. inch has been used. If the temperature is raised, a lower pressure may be used and at a temperature of 450° C. a pressure of 1,000 lbs./sq. inch has been used. It is found that a 2% to 3% plastic deformation of the malleable metal layer may readily be obtained and with a normal aperture depth of 0.2μ to 1μ, adequate penetration into the apertures is obtained together with good adherence to the insulating surface and electrical connection to the semiconductor regions over semiconductor slices which may be 55 mm. or more in diameter. When metal layer deformation is concerned, the factors of metal layer thickness, temperature and pressure are interrelated and for obtaining good adherence and electrical connection, time is also a factor. Thus with increase in time the pressure necessary to provide equivalent adherence and low-resistance electrical connection may be reduced. It is found that the pressure applied in the bonding does give rise to some surface damage of the semiconductor material but this is small and is less than the equivalent damage caused by polishing with 1μ diamond paste.

If the semiconductor material is of silicon, at least part of the insulating layer may be of silicon oxide or silicon nitride. It is mentioned that the surface of the insulating layer may have been modified in a treatment of the semiconductor. For example, the surface of a silicon oxide layer is modified when the layer is used as a mask in a boron diffusion step, to a boron glass.

The apertures in the insulating layer may provide direct access to the surface of the semiconductor material or alternatively a metal contact may be provided in an aperture or extending beyond the aperture, to which the metal layer is connected by the pressure welding.

The metal layer may be of aluminum and may typically be between 12μ and 250μ thick. In some cases it may be desired to use a thinner metal layer, for example, 5μ thick. If it is desired to have a metal layer thickness greater than 250μ it may be preferred to use two metal layers, the metal layer adjacent the body being thinner and not more than 250μ thick and the metal layer remote from the body being thicker. The two metal layers and the semiconductor body are pressed together so that the thin metal layer provides the desired adherence and connection and at the same time the two metal layers are secured together.

A conductive layer of say 25μ or more thickness, may be desirable for use with high current devices such as thyristors.

The method according to the invention may be used in the manufacture of devices of the beam lead type in which components of an integrated circuit are isolated from one another by removal of intermediate semiconductor material, the isolated components being held together by the applied conductors; in this case the metal layer thickness may for example be 12μ; it need not be great since the isolated parts are light in weight. A single metal layer may be pressure welded to a plurality of substrates at the same time and in the same press, for example a press having a common hydraulic cylinder operating on a plurality of tools may be used.

If desired, the plunger of the press may be deformable, for example, may have an air cushion on its operating face. This assists the equalisation of pressure over the workpiece, the brittle semiconductor body. It is mentioned that in etching windows in an insulating layer some degree of undercutting will occur so that the flow of the malleable material of the metal layer is facilitated.

If a thick metal layer is used, it is necessary to take into account that the line-width accuracy obtainable in subsequent etching of the metal layer is limited by the metal layer thickness. If a high degree of accuracy is required, the thick metal layer may be etched over a greater area and then detailed etching effected within this greater area. The metal layer outside this greater area remains thick and is thus mechanically stronger and has a lower resistance to current flow with consequent limitation of resistance heating during current flow.

In the provision of large area contacts, the metal layer may be secured to a backing material which is not of necessity malleable and the metal layer put under pressure in the press between the body and the backing material. For example, a back contact may be made to a silicon device using a gold foil on a molybdenum backing and the back contact may be provided in a single pressing operation at the same time as an unbacked foil is secured to the other front major face of the body. Where heating is effected heat may be applied to both sides or only one side in the press. If connections are made to the front and back surfaces of a semiconductor die it may be that different temperature conditions are required at the two surfaces. Thus if an aluminum foil is secured to the front surface and a gold foil on a molybdenum backing is secured to the back surface, the front surface will, if heating is used, desirably be hotter. This can be achieved either by heating only at the front surface or by differentially heating the two surfaces so that the front surface is hotter.

The invention also relates to a semiconductor device when manufactured by the method according to the invention.

Figure 1B:
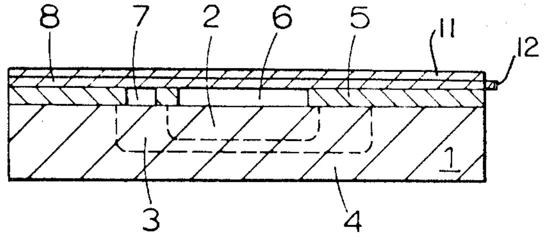
Figure 2:
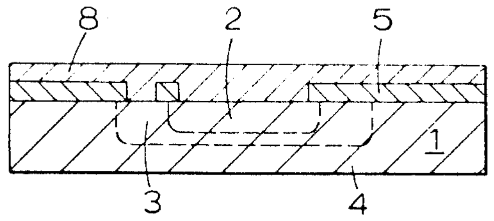
Figure 3:
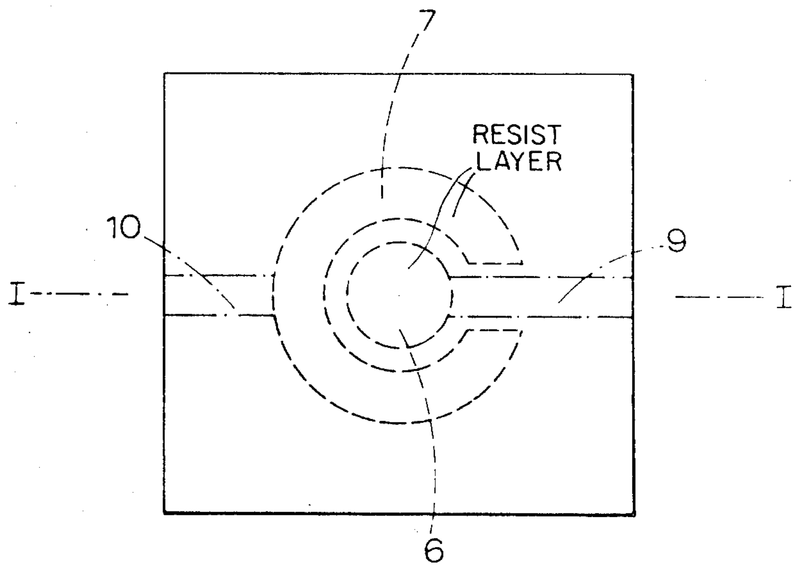

Embodiments of the method according to the invention will now be described, by way of example, with reference to the accompanying diagrammatic drawing in which:

FIGS. 1*a*, 1*b* and 2 are cross sectional views taken along the line I—I of FIG. 3 and illustrating two stages in the method, and FIG. 3 is a plan view.

The drawing illustrates the manufacture of a transistor comprising a silicon single crystal 1 in which are provided an emitter region 2, a base region 3 and a collector region 4.

The manner in which the regions 2, 3 and 4 are provided and whether the transistor is of n-p-n or p-n-p structure are immaterial. Methods of manufacturing such transistors are well known.

The dimensions of the body 1 may be 55 mm. diameter x 0.25 mm. thick.

An apertured insulating oxide layer 5 about 0.5μ thick is provided on the body 1. Aperture 6 provides communication with the emitter region 2 and aperture 7 provides communication with the base region 3. Connection to the collector region 4 is not shown and is usually made by way of the lower surface of the body 1. The collector connection may be provided by the pressure method described above.

A sheet of aluminum foil 8, 15μ thick, is placed on the oxide layer 5 as is shown in FIG. 1*a*. Alternatively, as shown in FIG. 1*b*, a second metal layer 11, or insulating material may be placed over the aluminum foil 8. The foil 8 is provided with a tab 12 for making an electrical connection. The whole is placed in a press which may be a self-aligning press and at room temperature a pressure of 20 tons/sq. inch is applied across the foil 8 and the lower surface of the body 1. Such a press would be a 60 to 80 ton press. However, with heating at about 400° C., a 15 ton press would suffice.

It has been found that the base of the press supporting the body 1 should preferably be rigid although the rigid base itself may be on a resilient mounting. The pressure is applied gradually, for example within a period of 30 seconds at room temperature. It has been found that the silicon slice described will stand a bending of 1% without fracturing, bending being defined as maximum deflection divided by the length of the body 1 over which the deflection has occurred. The bending may be greater than 1% without breakage of the slice if the slice is substantially strain-free.

FIG. 2 shows the manner in which the material of the foil 8 flows into the apertures 6 and 7 during pressure welding. After pressure welding, the foil 8 is found to adhere to the surface of the oxide layer 5 and to the surface of the body 1 at the sites of the apertures 6 and 7 to provide electrical connection to the emitter region 2 and the base region 3. The total area of adherence is greater than 0.25 sq. mm.

FIG. 3 shows the outline of the apertures 6 and 7 in broken lines and conductive connections 9 and 10 in chain-dot lines. After the pressure welding operation, with the aid of a photosensitive resist material, the parts within the chain-dot lines 9 and 10 and within the broken lines at 6 and 7 are protected by the resist layer during an etching step in which the unwanted remainder of the aluminum foil 8 is removed.

A patterned foil may be provided between an apertured insulating layer provided on a semiconductor body and an insulating carrier, for example of glass, alumina or zirconia, and the whole pressure welded so that the semiconductor body is provided with contacts and conductors and at the same time secured by way of the foil to the carrier. The foil may be sufficiently thick that foil projecting beyond the carrier can be used as conductive connection wires for the semiconductor devices. The relative positions of the patterned foil and the semiconductor body may be adjusted optically for example through the body using an infra-red microscope before pressure welding. If glass is used for the carrier a temperature of 300° C. to 400° C. may be established at the foil-glass interface. As mentioned above etching is not possible when the foil is sandwiched and the fully patterned foil can be provided with an edge portion or edge portions which can be cropped to leave separated projecting portions. As an alternative if projecting portions are not required the metal layer may be provided by a deposition process.

Although the description given above relates to the manufacture of a single transistor, it will be realised that the body 1 may form part of a larger body in which case the conductors 9 and 10 may extend to provide connections to other circuit elements, whether active or passive, provided in the extension of the body 1 or on the extension of the layer 5.

Silicon has been mentioned above as an example of a semiconductor body material. As alternatives, the elementary semiconductor germanium or semiconductor compounds such as gallium arsenide and indium antimonide may be used. It is of course necessary that the load used in the pressure welding is not greater than the compressive strength of the selected semiconductor material.

As alternatives the materials aluminum and gold, silver, copper and nickel may be used for the foil. It is not necessary that the foil is of elementary material and alloys may alternatively be used. Further, as mentioned above in the case of molybdenum and gold, the foil may be provided secured to a backing material which is not necessarily malleable. The metal layer may be plated on the backing material. The backing material and the metal layer, if thick, will of course be selected so that their thermal expansion characteristics are not too different from that of the selected semiconductor material.

In general it is mentioned that no particular difficulties have been experienced in relation to deformation. Factors affecting deformation, where windows are used, are the area and depth of the windows and the thickness and the material of the metal layer. The deformation may be as low as 2% and no difficulties have been experienced with much higher deformation percentages.

Soft solder as a material is more readily deformable than gold which in turn is better in this respect than aluminum.

A typical aperture may be 0.25 sq. mm. in area and this area is greater than that over which wire bonding is known to take place. A wire may be 17μ to 50μ in diameter and in extreme cases not greater than 150μ in diameter. Obviously, the area of adherence will normally be much greater than 0.25 sq. mm. In the case of an apertured insulating layer there will be adherence at a plurality of apertures and also to the insulating layer. The adherence at the apertures may either be to the semiconductor material or to a metal contact already provided at the aperture. It is mentioned also that where conductor material is provided at the aperture it may project by 2μ to 3μ above the adjacent insulating layer. In the case of a power semiconductor device contact may readily be made to a large area of semiconductor material, for example, from 20 mm. to 38 mm. in diameter. Large area contacts such as these have not previously been highly satisfactory. Where large area pressure welding is concerned, it may be advantageous to build up the pressure load slowly, for example, over a period from 30 secs. to 60 secs.

The aperture depth can quite easily be from 0.4μ to 2μ for oxide coatings and even up to 5μ to 8μ in some cases. For larger area apertures the depth may be much greater and one thyristor uses a depth of 75μ. If there is any real limitation in practice, it is that the initial thickness of the metal layer should not be less than the depth of the aperture. For an aperture depth of 75μ, in practice a very comfortable metal layer thickness is 150μ.

A typical, but by no means limiting, example of pressure welding to silicon using soft solder uses 50 kg./sq. in. at room temperature and 10 kg./sq. in. at 150° C. The time during which these pressures are maintained may typically be between a few seconds and thirty seconds. For gold and silicon the maximum temperature is about 350° C. and will usually be about 250° C. at a pressure of 10 kg./sq. in. It is mentioned that the eutectic temperature varies with pressure and is to be taken to be the temperature at which fusion begins at the interface under the pressure conditions concerned.

The method according to the invention permits cold pressure welding (that is at room temperature) to some semiconductor materials, which may be used in photoelectric devices, which are unstable when heated and in this case, as in all cases, there is the need for greater malleability with increasing brittleness of the semiconductor material and decreased temperature. Indium may be used as the material of the metal layer for such photoelectric devices.

What we claim is:

1. A method of manufacturing a semi-conductor device having an apertured insulating layer covering at least a portion of the surface of a body of semi-conductive material comprising the steps of providing a layer of malleable metal over and in contact with the insulating layer, and placing the metal layer and the body with the insulating layer under pressure in a press at a temperature below the eutectic temperature of the metal of the layer and the semi-conductor material so that a pressure weld is effected between the insulating material and the metal layer and between the semi-conductive material and the metal layer over an area of at least 0.25 sq. mm. whereby electrically conductive connection is provided between the metal layer and the semi-conductor material.

2. A method as claimed in claim 1, in which pressure welding is effected at an elevated temperature.

3. A method as claimed in claim 2, in which the semiconductor material is silicon and at least part of the insulating layer is silicon oxide.

4. A method as claimed in claim 2, in which the semiconductor material is of silicon and at least part of the insulating layer is of silicon nitride.

5. A method as claimed in claim 2, in which the insulating layer has a plurality of apertures and in at least some of the apertures in the insulating layer a metal contact is provided and is pressure welded to the metal layer.

6. A method as claimed in claim 1, in which the metal layer is pressure welded to a plurality of bodies each with an apertured insulating layer at the same time and in the same press.

7. A method as claimed in claim 1, in which the metal layer is aluminum.

8. A method as claimed in claim 1, in which the metal layer is between 12μ and 250μ thick.

9. A method as claimed in claim 1, in which two metal layers are used, the metal layer adjacent the body with the insulating layer being thinner than that remote from the body and the pressure welding is such that the metal layer adjacent the body with the insulating layer is secured to the body and to the other metal layer.

10. A method as claimed in claim 1, in which the metal layer is a continuous sheet and a finally desired pattern is produced by covering the pressure-welded metal layer with an optically-sensitive layer, exposing and developing the optically-sensitive layer to provide a patterned resist and etching away the unwanted parts of the metal layer unprotected by the resist.

11. A method as claimed in claim 10, in which at an area where a higher degree of accuracy in the pattern of the metal layer is required, the metal layer is pre-etched with the aid of a first resist over a greater area and a second etch is effected within the greater area with the aid of a second resist.

12. A method as claimed in claim 1, in which at least a portion of the metal layer is secured to a backing material and the pressure for pressure welding is applied across the metal layer by way of the body and the backing.

13. A method as claimed in claim 1, in which the metal layer is in the form of a desired pattern and is positioned between a substantially flat surface and an insulating carrier and is pressure welded to the substantially flat surface and also to provide electrical contact to the semiconductor material by way of the apertures and to the carrier.

14. A method as claimed in claim 13, in which the carrier is of glass.

15. A method as claimed in claim 13, in which the metal layer projects beyond the carrier to provide conductive connection wires for the semi-conductor device.

References Cited

UNITED STATES PATENTS

| | | | |
|---|---|---|---|
| 2,610,386 | 9/1952 | Saslaw | 29—572 |
| 3,200,468 | 8/1965 | Dahlberg | 29—589 |
| 3,228,104 | 1/1966 | Emeis | 29—590 |
| 3,241,931 | 3/1966 | Triggs et al. | |
| 3,274,667 | 9/1966 | Siebertz | 29—589X |
| 3,333,324 | 8/1967 | Roswell et al. | |
| 3,471,923 | 10/1969 | Lamorte et al. | 29—590X |

JOHN F. CAMPBELL, Primary Examiner

W. TUPMAN, Assistant Examiser

U.S. Cl. X.R.

29—625, 628, 630, 589